United States Patent
Lei

(10) Patent No.: US 12,155,388 B2
(45) Date of Patent: Nov. 26, 2024

(54) LOW KICKBACK NOISE COMPARATOR

(71) Applicant: REALTEK SEMICONDUCTOR CORPORATION, Hsinchu (TW)

(72) Inventor: Liang-Huan Lei, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 55 days.

(21) Appl. No.: 18/118,755

(22) Filed: Mar. 8, 2023

(65) Prior Publication Data

US 2023/0299755 A1    Sep. 21, 2023

(30) Foreign Application Priority Data

Mar. 21, 2022  (TW) .................................. 111110358

(51) Int. Cl.
- *H03K 3/037* (2006.01)
- *H03K 3/012* (2006.01)
- *H03K 3/013* (2006.01)
- *H03K 5/24* (2006.01)

(52) U.S. Cl.
CPC ........... *H03K 3/0375* (2013.01); *H03K 3/012* (2013.01); *H03K 3/013* (2013.01); *H03K 5/249* (2013.01)

(58) Field of Classification Search
CPC .................................................. H03K 3/0375
USPC ......................................................... 327/202
See application file for complete search history.

(56) References Cited

U.S. PATENT DOCUMENTS 8,692,582 B1 * 4/2014 Atesoglu ................ H03K 5/249
327/97

FOREIGN PATENT DOCUMENTS

CN    101944895 A    *    1/2011

OTHER PUBLICATIONS

P. M. Figueiredo and J. C. Vital, "Kickback noise reduction techniques for CMOS latched comparators," in IEEE Transactions on Circuits and Systems II: Express Briefs, vol. 53, No. 7, pp. 541-545, Jul. 2006, doi: 10.1109/TCSII.2006.875308.
OA letter of a counterpart TW application (appl. No. 111110358) mailed on Nov. 30, 2022. Summary of the TW OA letter in regard to the TW counterpart application: 1. Claims 1-10 are rejected as allegedly being anticipated by cited reference 1 (CN 101944895 A). Correspondence between claims of TW counterpart application and claims of US application: 1. Claims 1-10 in TW counterpart application correspond to claims 1-10 in US application, respectively.

* cited by examiner

*Primary Examiner* — Tomi Skibinski
(74) *Attorney, Agent, or Firm* — WPAT, P.C.

(57) ABSTRACT

A comparator includes an input pair circuit, an isolation circuit, and a latch circuit. The input pair circuit receives first and second input signals to generate first and second signals. The isolation circuit is selectively turned on according to a clock signal to transmit the first signal from the input pair circuit to a first output node and transmit the second signal from the input pair circuit to a second output node. The latch circuit adjusts a level of the first output node to generate a first output signal, adjusts a level of the second output node to generate a second output signal, and selectively resets the levels of the first and the second output nodes according to the clock signal. When the latch circuit resets the levels of the first and the second output nodes, the isolation circuit is not turned on.

10 Claims, 5 Drawing Sheets

LOW KICKBACK NOISE COMPARATOR

BACKGROUND OF THE INVENTION

1. Field of the Invention

The present disclosure relates to a comparator. More particularly, the present disclosure relates to a comparator able to reduce impacts from kickback noises.

2. Description of Related Art

A comparator may operate as a basic quantizer and is thus commonly used in an analog-to-digital converter or a digital-to-analog converter. When an existing comparator enters a reset state or enters from the reset state to a comparison state for comparing signals, a transient voltage change occurs at an internal node of the comparator. This voltage change may cause kickback noise(s) via parasitic capacitor(s) in the circuit, which results in a degradation of the performance of the comparator. In some related approaches, additional capacitor(s) may be employed to reduce the kickback noise(s). However, the additional capacitor(s) may slow down the speed of the comparator, and errors may be present between the capacitance value of the additional capacitor(s) and the capacitance value of the parasitic capacitor(s) in practical applications, such that impacts from the kickback noise(s) cannot be completely reduced.

SUMMARY OF THE INVENTION

In some aspects, one object of the present disclosure is, but not limited to, to provide a comparator able to reduce impacts from kickback noise(s), in order to address the deficiencies of the prior art.

In some aspects, a comparator includes an input pair circuit, an isolation circuit, and a latch circuit. The input pair circuit is configured to receive a first input signal and a second input signal to generate a first signal and a second signal. The isolation circuit is configured to be selectively turned on according to a first clock signal to transmit the first signal from the input pair circuit to a first output node and transmit the second signal from the input pair circuit to a second output node. The latch circuit is configured to adjust a level of the first output node to generate a first output signal, adjust a level of the second output node to generate a second output signal, and selectively reset the level of the first output node and the level of the second output node according to the first clock signal, in which when the latch circuit resets the level of the first output node and the level of the second output node, the isolation circuit is not turned on.

In some aspects, a comparator may utilize an isolation circuit to reduce impacts from kickback noise(s), in order to improve the performance of the comparator.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
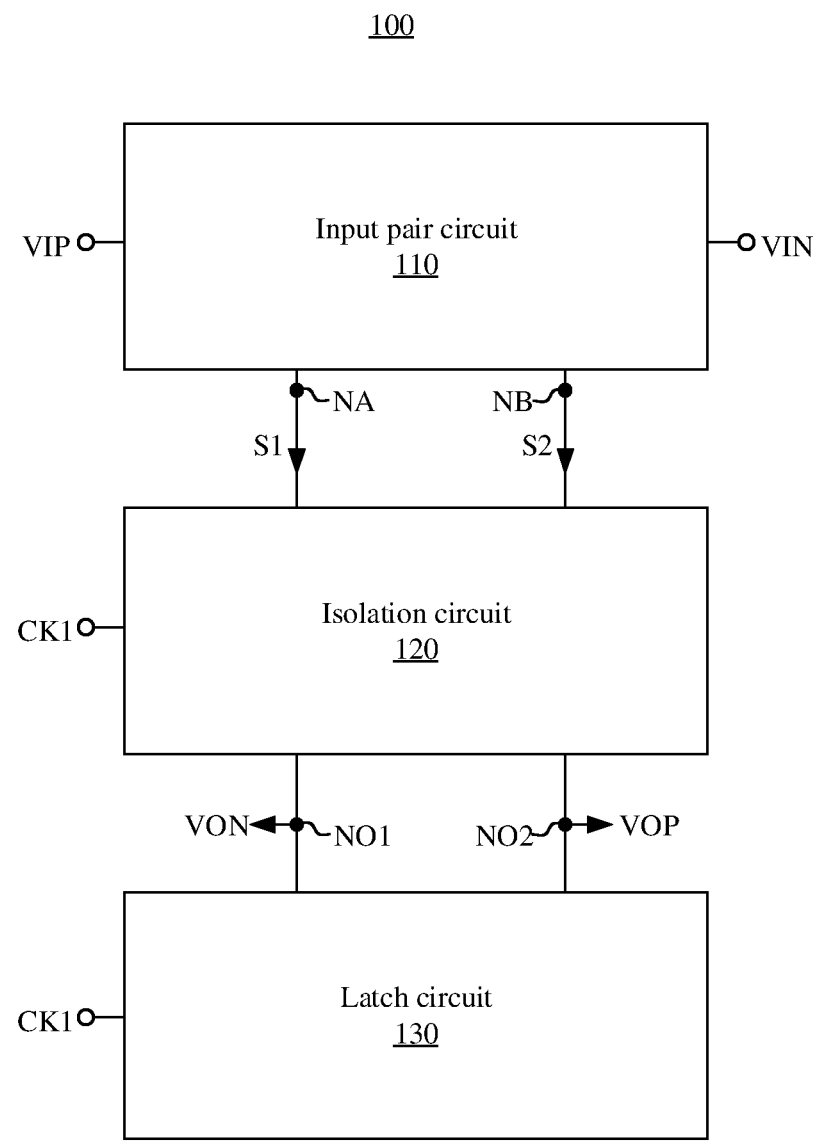
FIG. 1 illustrates a schematic diagram of a comparator according to some embodiments of the present disclosure.

FIG. 1 illustrates a schematic diagram of a comparator 100 according to some embodiments of the present disclosure. In some embodiments, the comparator 100 may be applied in an analog to digital converter or a digital to analog converter. The comparator 100 includes an input pair circuit 110, an isolation circuit 120, and a latch circuit 130. The input pair circuit 110 receives an input signal VIP and an input signal VIN, generates a signal S1 from a node NA, and generates a signal S2 from a node NB. The isolation circuit 120 may be selectively turned on according to a clock signal CK1, in order to transmit the signal S1 from the input pair circuit 110 an output node NO1 and transmit the signal S2 from the input pair circuit 110 to an output node NO2.

As shown in FIG. 1, the isolation circuit 120 is coupled between the input pair circuit 110 and the latch circuit 130. The latch circuit 130 is configured to adjust a level of the output node NO1 to generate an output signal VON and adjust a level of the output node NO2 to generate an output signal VOP. In some embodiments, the level of the output signal VON and the level of the output signal VOP may be utilized to indicate a comparison result of the input signal VIP and the input signal VIN. For example, when the input signal VIP is higher than the input signal VIN, the output signal VON may have a high level and the output signal VOP may have a low level. On the other hand, when the input signal VIP is lower than the input signal VIN, the output signal VON may have the low level and the output signal VOP may have the high level. In some embodiments, the latch circuit 130 may operate as a positive feedback circuit, in order to rapidly adjust the level of the output signal VOP and the level of the output signal VON to rail-to-rail levels. Furthermore, the latch circuit 130 may selectively reset the level of the output node NO1 and that of the output node NO2 according to the clock signal CK1. For example, when the clock signal CK1 has a first level (which may be, but not limited to, a high level), the latch circuit 130 may reset the level of the output node NO1 and that of the output node NO2 to a predetermined level (which may be, but not limited to, a ground voltage). When the clock signal CK1 has a second level (which may be, but not limited to, a low level), the latch circuit 130 may not reset the level of the output node NO1 and that of the output node NO2. Under this condition, the comparator 100 may compare the input signal VIP with the input signal VIN to generate the corresponding output signals VON and VOP.

In general, when a comparator is switched from one of a reset state (in this state, the level of the output node is reset) and a comparison state (in this state, the level of the output node is not controlled by a reset circuit) to another one of those states, a voltage change is present on the output node. A comparator in some related approaches, an input pair circuit is directly connected to a latch circuit. In those approaches, kickback noise(s) may be generated and transmitted to input terminals of the input pair circuit via parasitic capacitor(s) of a transistor, which results in degradation of a performance of the comparator. Compared with those approaches, in some embodiments of the present disclosure, the isolation circuit 120 is arranged between the input pair circuit 110 and the latch circuit 130, and when the latch circuit 130 resets the level of the output node NO1 and that of the output node NO2, the isolation circuit 120 is not turned on. As a result, it is able to further reduce the coupling between the input pair circuit 110 and the output nodes NO1-NO2. With such arrangements, the impacts from kickback noise(s) on the comparator 100 can be reduced.

In some embodiments, the isolation circuit 120 is further configured to couple the node NA to the node NB when the latch circuit 130 resets the level of the output node NO1 and that of the output node NO2, in order to further reduce the impacts from the kickback noise(s). Operations regarding herein will be provided with reference to the following figures.

Figure 2A:
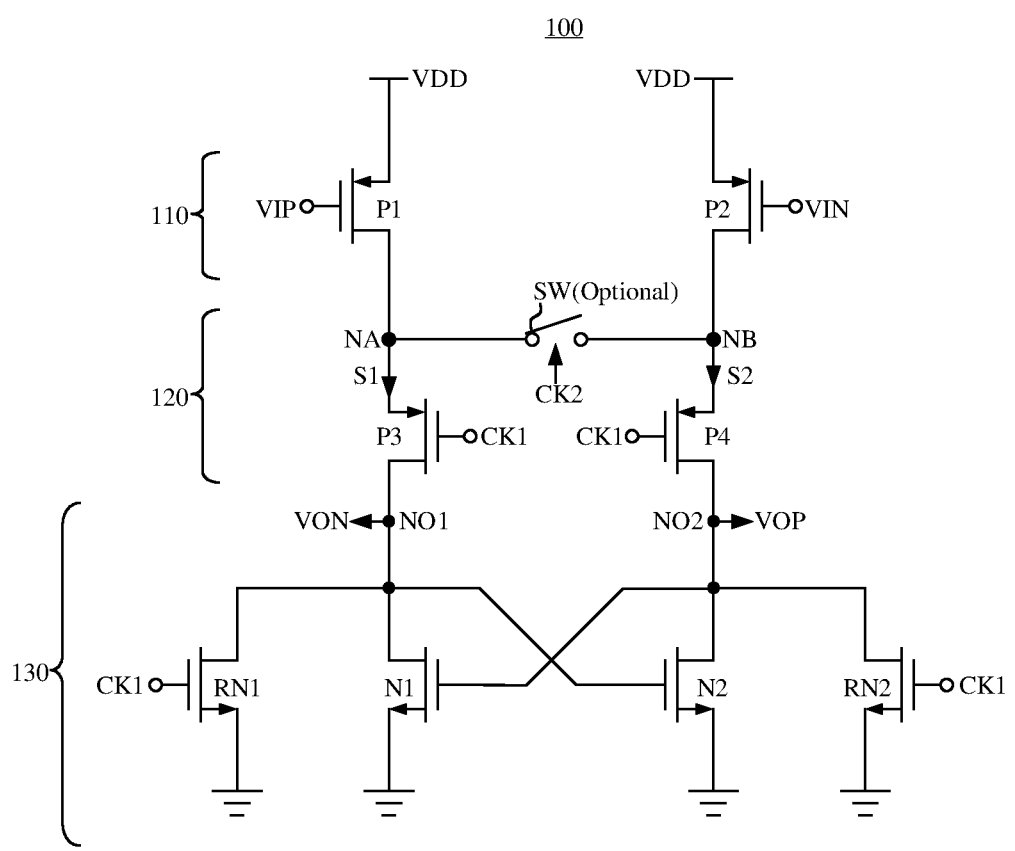
FIG. 2A illustrates a schematic diagram of the comparator in FIG. 1 according to some embodiments of the present disclosure.

FIG. 2A illustrates a schematic diagram of the comparator 100 in FIG. 1 according to some embodiments of the present disclosure. In this example, the input pair circuit 110 includes a switch P1 and a switch P2. A first terminal of the switch P1 (e.g., source) receives a supply voltage VDD, a second terminal of the switch P1 (e.g., drain) is coupled to the node NA and outputs the signal S1, and a control terminal of the switch P1 (e.g., gate) receives the input signal VIP. A first terminal of the switch P2 receives the supply voltage VDD, a second terminal of the switch P2 is coupled to the node NB and outputs the signal S2, and a control terminal of the switch P2 receives the input signal VIN. The switch P1 may be selectively turned on according to the input signal VIP to generate the signal S1, and the switch P2 may be selectively turned on according to the input signal VIN to generate the signal S2.

The isolation circuit 120 includes a switch P3 and a switch P4. A first terminal of the switch P3 is coupled to the node NA to receive the signal S1, a second terminal of the switch P3 is coupled to the output node NO1, and a control terminal of the switch P3 receives the clock signal CK1. A first terminal of the switch P4 is coupled to the node NB to receive the signal S2, a second terminal of the switch P4 is coupled to the output node NO2, and a control terminal of the switch P4 receives the clock signal CK1. In other words, the switch P3 is coupled between the input pair circuit 110 and the output node NO1 and may be selectively turned on according to the clock signal CK1 to transmit the signal S1 from the input pair circuit 110 to the output node NO1. Similarly, the switch P4 is coupled between the input pair circuit 110 and the output node NO2 and may be selectively turned on according to the clock signal CK1 to transmit the signal S2 from the input pair circuit 110 to the output node NO2.

The latch circuit 130 includes a switch N1, a switch N2, a reset switch RN1, and a reset switch RN2. A first terminal of the switch N1 (e.g., drain) is coupled to the output node NO1, a second terminal of the switch N1 (e.g., source) is coupled to ground, and a control terminal of the switch N1 (e.g., gate) is coupled to the output node NO2. A first terminal of the switch N2 is coupled to the output node NO2, a second terminal of the switch N2 is coupled to ground, and a control terminal of the switch N2 is coupled to the output node NO1. The switch N1 may be selectively turned on according to the level of the output node NO2, in order to pull down the level of the output node NO1 to ground. Similarly, the switch N2 may be selectively turned on according to the level of the output node NO1, in order to pull down the level of the output node NO2 to ground. A first terminal of the reset switch RN1 is coupled to the output node NO1, a second terminal of the reset switch RN1 is coupled to ground, and a control terminal of the reset switch RN1 receives the clock signal CK1. A first terminal of the reset switch RN2 is coupled to the output node NO2, a second terminal of the reset switch RN2 is coupled to ground, and a control terminal of the reset switch RN1 receives the clock signal CK1. The reset switch RN1 may be selectively turned on according to the clock signal CK1, in order to pull down the level of the output node NO1 to ground. The reset switch RN2 may be selectively turned on according to the clock signal CK1, in order to pull down the level of the output node NO2 to ground.

When the clock signal CK1 has a first level (which may be a high level in this example), the comparator 100 enters a reset state. Under this condition, the reset switch RN1 and the reset switch RN2 are turned on to reset the level of the output node NO1 and that of the output node NO2. On other hand, the switch P3 and the switch P4 are not turned on to cut off the connection between the input pair circuit 110 and the latch circuit 130, in order to reduce the impacts from kickback noise(s).

When the clock signal CK1 has a second level (which may be a low level in this example), the comparator 100 enters a comparison state to compare the input signal VIP with the input signal VIN. Under this condition, the reset switch RN1 and the reset switch RN2 are turned off, in order not to control the level of the output node NO1 and that of the output node NO2. On the other hand, the switch P3 and the switch P4 are turned on to connect the input pair circuit 110 to the latch circuit 130, in order to generate a comparison result between the input signal VIP and the input signal VIN (i.e., the output signal VON and the output signal VOP). For example, if the input signal VIP is lower than the input signal VIN, a current value of the signal S1 is higher than that of the signal S2, such that the level of the output node NO1 (e.g., the level of the supply voltage VDD) is higher than that of the output node NO2. In response to the above levels, the switch N2 is turned on to pull down the level of the output node NO2. As a result, the comparator 100 may output the output signal VON having the high level and the output signal VOP having the low level. Alternatively, if the input signal VIP is higher than the input signal VIN, the current value of the signal S1 is lower than that of the signal S2, such that the level of the output node NO1 is lower than that of the output node NO2. In response to the above levels, the switch N1 is turned on to pulled down the level of the output node NO1. As a result, the comparator 100 may out the output signal VON having the low level and the output signal VIP having the high level.

Accordingly, it is understood that when the latch circuit 130 resets the level of the output node NO1 and that of the output node NO2, the isolation circuit 120 is not turned on to reduce the coupling between the input pair circuit 110 and the latch circuit 130, in order to reduce the impacts from kickback noise(s). In some optional embodiments, the isolation circuit 120 may further include a switch SW. The switch SW is coupled between the node NA and the node NB and is selectively turned on according to the clock signal CK2. When the comparator 100 enters the reset state (i.e., when the latch circuit 130 resets the level of the output node NO1 and that of the output node NO2), the switch SW is turned on to couple the node NA to the node NB, in order to ensure that the level of the node NA is the same as that of the node NB to further reduce the impacts from kickback noise(s). In other words, in the isolation circuit 120, when the switch SW is turned on, the switch P3 and the switch P4 are not turned on. Alternatively, when the switch SW is not turned on, the switch P3 and the switch P4 is turned on.

Figure 2B:
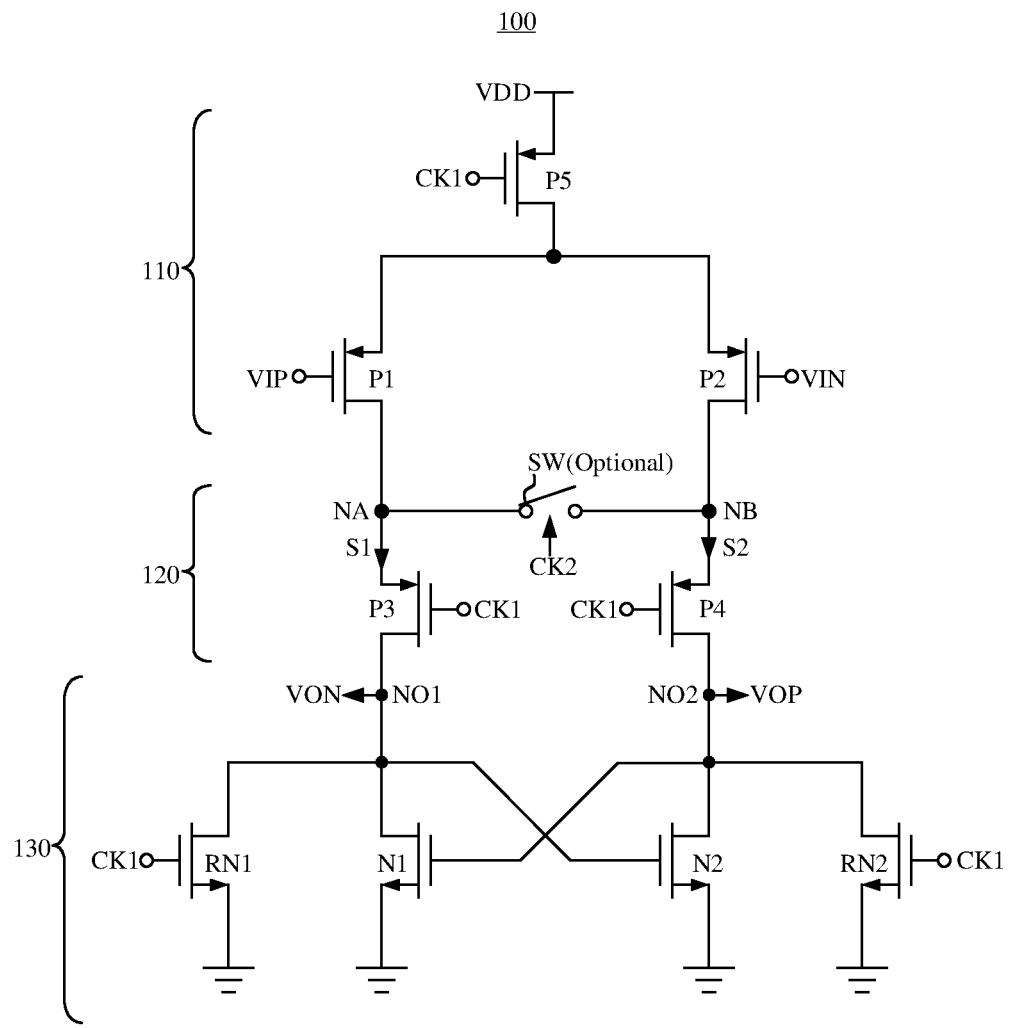
FIG. 2B illustrates a schematic diagram of the comparator in FIG. 1 according to some embodiments of the present disclosure.

FIG. 2B illustrates a schematic diagram of the comparator 100 in FIG. 1 according to some embodiments of the present disclosure. Compared with examples in FIG. 2A, in this example, the input pair circuit 110 may further include a switch P5. A first terminal of the switch P5 receives the supply voltage VDD, a second terminal of the switch P5 is coupled to the first terminals of the switches P1 and P2, and a control terminal of the switch P5 receives the clock signal CK1. The switch P5 operates as a current source circuit, which may be selectively turned on according to the clock signal CK1, in order to transmit the supply voltage VDD to the first terminals of the switches P1 and P2. When the comparator 100 enters the reset state, the switch P5 is not turned on, in order not to provide the supply voltage VDD to the switches P1 and P2. When the comparator 100 enters the comparison state, the switch P5 is turned on to provide the supply voltage VDD to the switches P1 and P2.

Figure 3A:
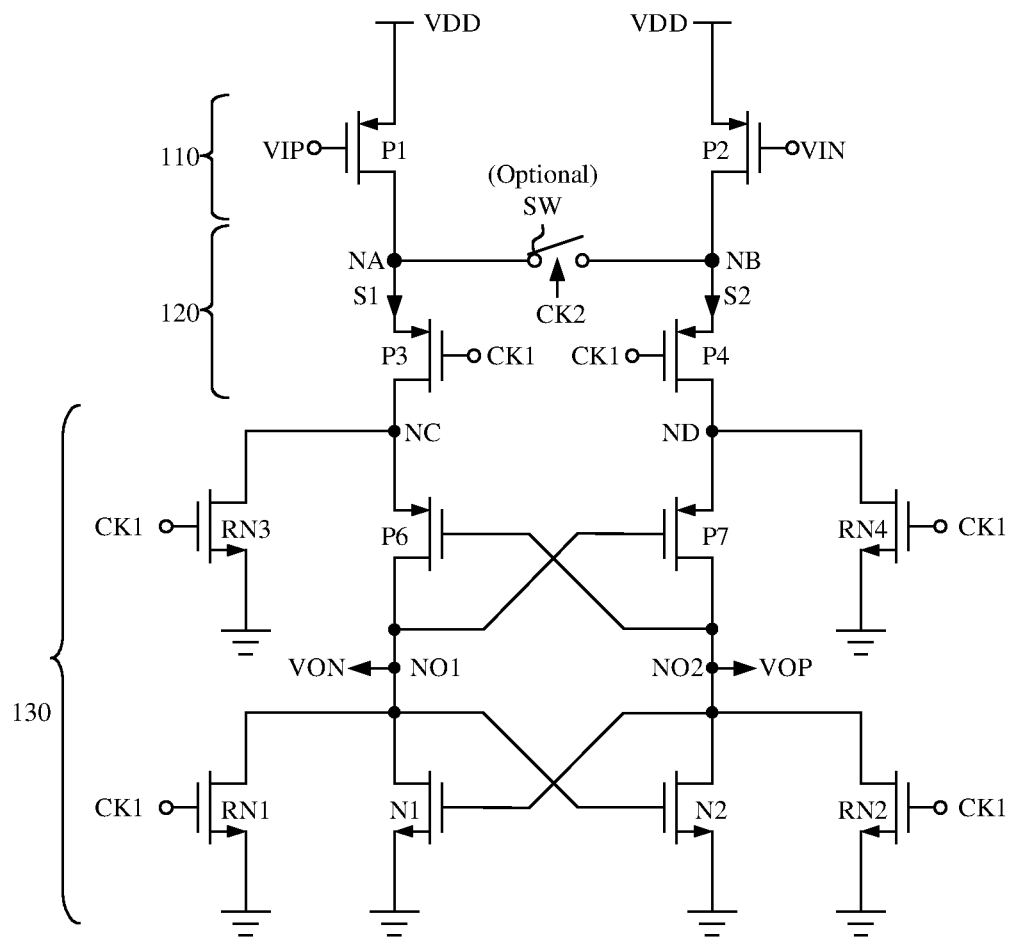
FIG. 3A illustrates a schematic diagram of the comparator in FIG. 1 according to some embodiments of the present disclosure.

FIG. 3A illustrates a schematic diagram of the comparator 100 in FIG. 1 according to some embodiments of the present disclosure. Compared with examples in FIG. 2A, in this example, the latch circuit 130 may further include a switch P6, a switch P7, a reset switch RN3, and a reset switch RN4. A first terminal of the switch P6 (e.g., source) and the isolation circuit 120 (e.g., the second terminal of the switch P3) are coupled to a node NC to receive the signal S1, a second terminal of the switch P6 (e.g., drain) is coupled to the output node NO1, and a control terminal of the switch P6 (e.g., gate) is coupled to the output node NO2. A first terminal of the switch P7 and the isolation circuit 120 (e.g., the second terminal of the switch P4) are coupled to a node ND to receive the signal S2, a second terminal of the switch P7 is coupled to the output node NO2, and a control terminal of the switch P7 is coupled to the output node NO1. The switch P6 may be selectively turned on according to the level of the output node NO2, in order to transmit the signal S1 to the output node NO1. Similarly, the switch P7 may be selectively turned on according to the level of the output node NO1, in order to transmit the signal S2 to the output node NO2. A first terminal of the reset switch RN3 is coupled to the node NC, a second terminal of the reset switch RN3 is coupled to ground, and a control terminal of the reset switch RN3 receives the clock signal CK1. A first terminal of the reset switch RN4 is coupled to the node ND, a second terminal of the reset switch RN4 is coupled to ground, and a control terminal of the reset switch RN4 receives the clock signal CK1. The reset switch RN3 may be selectively turned on according to the clock signal CK1, in order to pull down the level of the node NC to ground. The reset switch RN4 may be selectively turned on according to the clock signal CK1, in order to pull down the level of the node ND to ground.

When the comparator 100 enters the reset state, the level of each of the node NC, the node ND, the output node NO1, and the output node NO2 is reset to a low level. When the comparator 100 enters the comparison state, the signal S1 may be transmitted to the output node NO1 via the switch P6 during an initial interval of comparing the input signal VIP with the input signal VIN, and the signal S2 may be transmitted to the output node NO2 via the switch P7 during that initial interval. If he input signal VIP is lower than the input signal VIN, the current value of the signal S1 is higher than that of the signal S2, such that the level of the output node NO1 is higher than that of the output node NO2. As a result, the switch N2 is turned on to pull down the level of the output node NO2 to ground, the switch P6 is continuously turned on to pull up the level of the output node NO1 to the supply voltage VDD, and the switches N1 and P7 are turned off. As a result, the comparator 100 may output the output signal VON and the output signal VOP that have rail-to-rail levels faster.

Figure 3B:
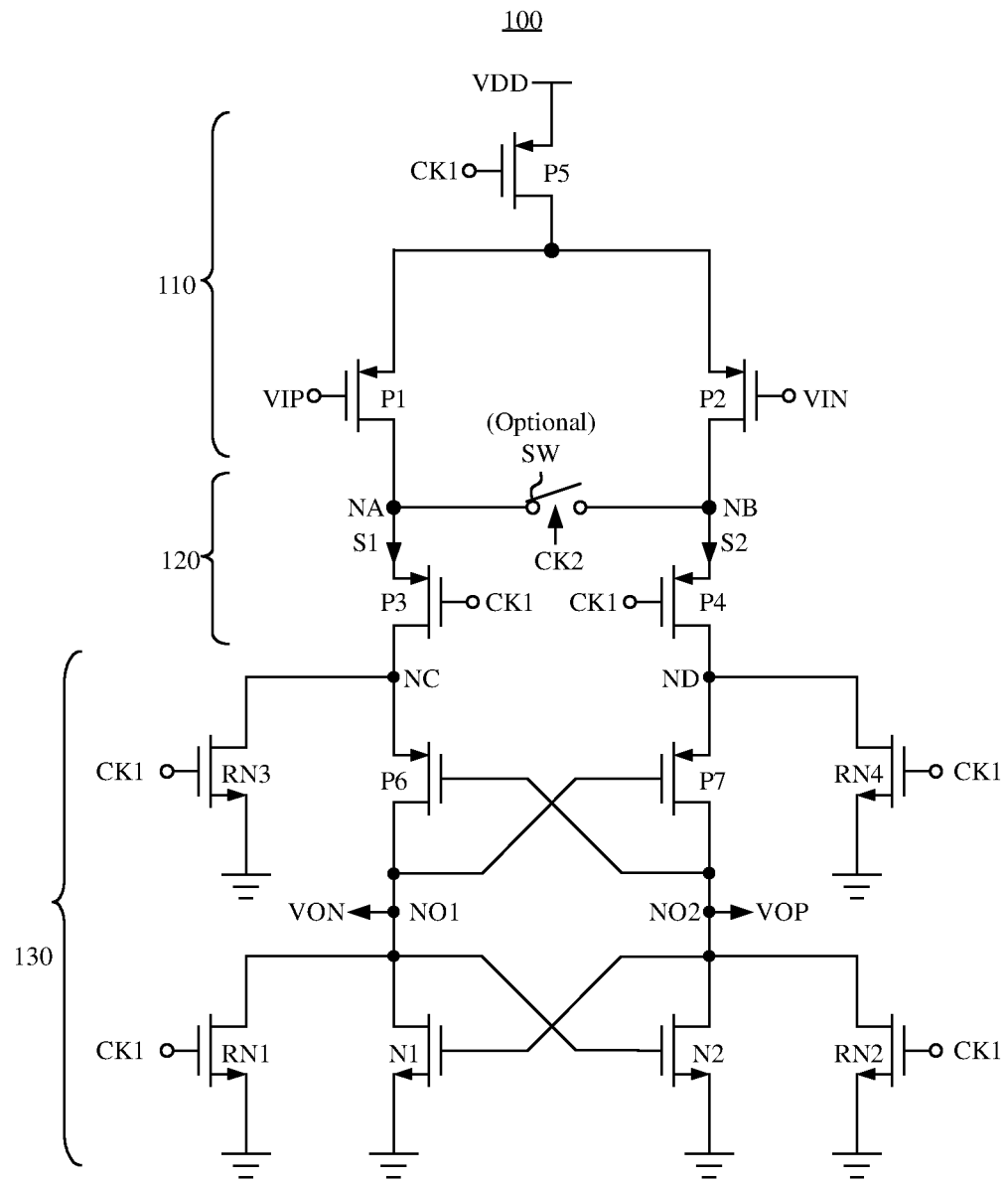
FIG. 3B illustrates a schematic diagram of the comparator in FIG. 1 according to some embodiments of the present disclosure.

FIG. 3B illustrates a schematic diagram of the comparator 100 in FIG. 1 according to some embodiments of the present disclosure. Compared with examples of FIG. 3A, in this example, the input pair circuit 110 further includes a switch P5. The arrangements and operations of the switch P5 are similar to those in FIG. 2B, and thus the repetitious descriptions are not further given.

In each aforementioned embodiment, various switches may be implemented with metal-oxide-silicon field-effect transistor(s), but the present disclosure is not limited thereto. According to practical requirements, various types of transistors may be utilized to implement various switches in each aforementioned embodiment.

As described above, the comparator provided in some embodiments of the present disclosure may utilize an isolation circuit to reduce impacts from kickback noises, and thus the performance of the comparator is improved.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A comparator, comprising:
   an input pair circuit configured to receive a first input signal and a second input signal to generate a first signal at a first node and a second signal at a second node;
   an isolation circuit configured to be selectively turned on according to a first clock signal to transmit the first signal from the input pair circuit to a first output node, and transmit the second signal from the input pair circuit to a second output node, wherein the isolation circuit further comprises a first switch connected between the first node and the second node; and
   a latch circuit configured to adjust a level of the first output node to generate a first output signal at the first output node, adjust a level of the second output node to generate a second output signal at the second output node, and selectively reset the level of the first output node and the level of the second output node according to the first clock signal,
   wherein when the latch circuit resets the level of the first output node and the level of the second output node, the isolation circuit is not turned on, and the first switch is turned on according to a second clock signal that is different from the first clock signal to directly connect the first node to the second node.

2. The comparator of claim 1, wherein the isolation circuit is configured to reduce an impact from a kickback noise which is generated when the latch circuit resets the level of the first output node and the level of the second output node.

3. The comparator of claim 1, wherein the isolation circuit further comprises:
   a second switch coupled between the input pair circuit and the first output node and configured to be selectively turned on according to the first clock signal; and
   a third switch coupled between the input pair circuit and the second output node and configured to be selectively turned on according to the first clock signal.

4. The comparator of claim 3, wherein when the first switch is turned on, the third switch and the second switch are not turned on.

5. The comparator of claim 1, wherein the latch circuit comprises:
   a second switch configured to be selectively turned on according to the level of the second output node, in order to pull down the level of the first output node to ground;
   a third switch configured to be selectively turned on according to the level of the first output node, in order to pull down the level of the second output node to ground;
   a first reset switch configured to be selectively turned on according to the first clock signal, in order to reset the level of the first output node to ground; and
   a second reset switch configured to be selectively turned on according to the first clock signal, in order to reset the level of the second output node to ground.

6. The comparator of claim 5, wherein the latch circuit further comprises:
   a fourth switch configured to be selectively turned on according to the level of the second output node, in order to transmit the first signal to the first output node, wherein the fourth switch and the isolation circuit are coupled to the first node to receive the first signal;
   a fifth switch configured to be selectively turned on according to the level of the first output node, in order to transmit the second signal to the second output node, wherein the fifth switch and the isolation circuit are coupled to the second node to receive the second signal;
   a third reset switch configured to be selectively turned on according to the first clock signal, in order to reset a level of the first node to ground; and
   a fourth reset switch configured to be selectively turned on according to the first clock signal, in order to reset a level of the second node to ground.

7. The comparator of claim 1, wherein the input pair circuit comprises:
   a second switch configured to be selectively turned on according to the first input signal to generate the first signal; and
   a third switch configured to be selectively turned on according to the second input signal to generate the second signal.

8. The comparator of claim 7, wherein the input pair circuit further comprises:
   a current source circuit configured to be selective turned on according to the first clock signal, in order to transmit a supply voltage to the third switch and the second switch.

9. The comparator of claim 1, wherein the isolation circuit is coupled between the input pair circuit and the latch circuit.

10. The comparator of claim 1, wherein the isolation circuit is further configured to couple the first node to the second node when the latch circuit resets the level of the first output node and the level of the second output node.

* * * * *